Oct. 3, 1961

E. W. HUTTERS 3,002,481

ELECTRICAL COMPONENT MOUNTING DEVICE

Filed May 31, 1955

INVENTOR.
EUGENE W. HUTTERS,
BY
Henry Heyman
ATTORNEY.

3,002,481

ELECTRICAL COMPONENT MOUNTING DEVICE

Eugene W. Hutters, Santa Monica, Calif., assignor to Hughes Aircraft Company, Culver City, Calif., a corporation of Delaware Filed May 31, 1955, Ser. No. 511,864
1 Claim. (Cl. 113—110)

This invention relates to devices for mounting electrical components, and particularly to devices for affixing electrical components to mechanically assembled circuit boards.

Modern techniques of electrical assembly include the mechanized manufacture of circuitry by the attachment of electrical components to printed circuits or etched wiring boards. The coupling should be uniform and reliable, both mechanically and electrically, but at the same time as simple and as economical as practicable. It is often desired to miniaturize electrical assemblies, and for such purposes particularly the devices of the prior art have not been wholly satisfactory. In addition, reliability and uniformity requirements are greatly accentuated where an assembly is to operate under wide temperature variations.

Accordingly, it is an object of this invention to provide an improved device for mounting electrical components in a circuit board, which device provides a more uniform and reliable structure than the devices of the prior art.

It is another object of this invention to provide an improved device, cheaper but at the same time more reliable than devices of the prior art, for affixing electrical components to small mechanically assembled wiring boards which are useable in wide temperature extremes.

It is another object of this invention to provide an improved eyelet member for use with printed circuit boards, which eyelet member facilitates rapid, inexpensive, and uniform fabrication of electrical assemblies.

In accordance with the invention, an electrical component may be affixed to a mechanically fabricated circuit board, such as a printed circuit board, by the use of an eyelet made entirely of a solder or of a solder-like material. The eyelet, having one flanged end, may be placed in the aperture defined by a conductive circuit pad on the circuit board. The unflanged end of the eyelet may then be turned outwardly to restrain the eyelet against the circuit pad. The lead from an electrical component may be entered within the eyelet, and the entire assembly dipped in a solder bath. The resultant structure provides a firm mechanical and uniform electrical coupling between the lead of the electrical component and the conductive circuit pad.

The novel features of the invention, as well as the invention itself, both as to its organization and method of operation, will best be understood in the light of the following description, taken together with the accompanying drawing, in which like reference numerals refer to like parts and in which.

Figure 2:
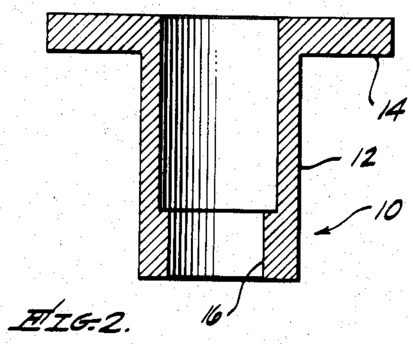
FIG. 2 is a side sectional view of the solder eyelet arrangement of FIG. 1, taken along the line 2—2 of FIG. 1 and looking in the direction of the appended arrows.
Figure 1:
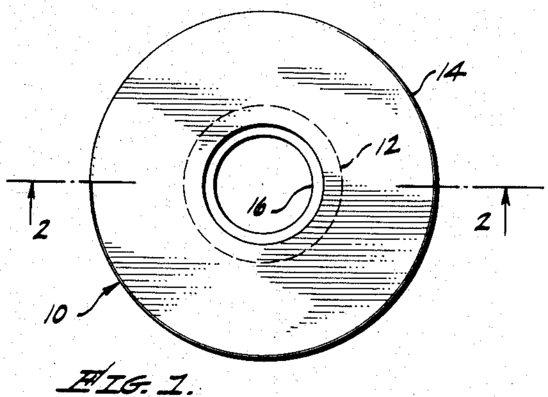
FIG. 1 is a plan view of a solder eyelet arrangement which may be employed in practicing the invention.

Referring now to FIGS. 1 and 2, an arrangement for practicing the invention may employ an eyelet 10 made of solder, a solder-like material, or some other conductive material having the property of melting or fusing at a relatively low temperature. A relatively low temperature, as used here, means a temperature at which a dip solder process may be carried out without heat damage to the elements of an electrical assembly. The eyelet 10 may comprise a central cylindrical portion 12 having an opening through which the lead of an electrical component may be placed. One end, here termed the head portion 14, of the eyelet 10 may be provided with a flange extending outwardly from and normal to the central portion 12. At the opposite end of the eyelet 10 may be provided an internal rim 16 defining an opening of smaller diameter than the opening of the central portion 12. The inner rim portion 16 is hereafter referred to as the base portion of the eyelet 10.

In practice, the eyelet 10 may be constructed, for example, of a composition consisting of approximately 22% tin and 78% lead. If desired, the composition employed may be varied in accordance with well known techniques, and may also be varied so that different temperatures or processes than those illustrated here may be employed. It is desirable that the melting point of the composition be so related to the melting point of the solder bath as to permit some flow of the solder eyelet. The thickness in cross section of the base portion 16 may be made the same as that of the head portion 14 to provide like structures during later steps in the process of fabricating a circuit assembly.

Figure 3A:
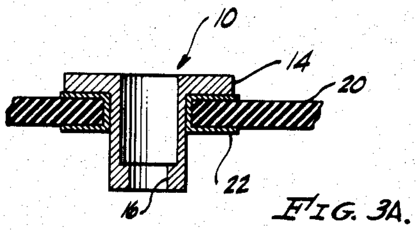
FIG. 3A is a sectional view showing a step in a process practiced in accordance with this invention.
Figure 3B:
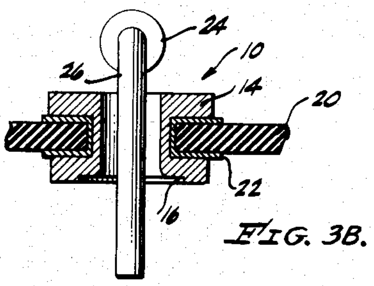
FIG. 3B is a section view of another step in the process.
Figure 3C:
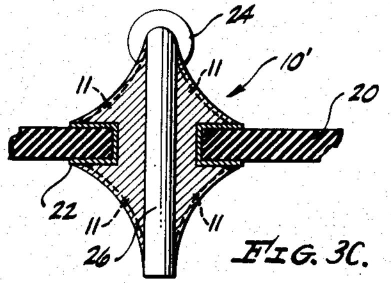
FIG. 3C is a sectional view of still another step in the process.

The manner in which the solder eyelet 10 may be employed in affixing an electrical component 24 to a circuit board 20 is shown in successive steps in FIGS. 3A, 3B and 3C. As shown in FIG. 3A, a circuit board 20 of nonconductive or dielectric material may be provided with a circuit pad 22 about the surfaces defining an aperture in the circuit board 20. The circuit pad 22 may be of conductive material and form part of an etched wiring or other printed circuit type of assembly. An electrical component 24 having an external lead 26 is to be mechanically and electrically coupled by its lead 26 to the circuit pad 22.

Figure 4:
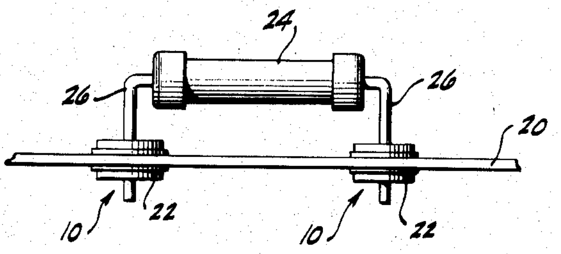
FIG. 4 is a side elevation of an assembly, in accordance with the invention, before dip-soldering.

As a first step in the process a solder eyelet 10 of suitable dimensions to register with the aperture defined by the circuit pad 22 may be inserted into the circuit board 20, as shown in FIG. 3A. As the second step in the process, the base portion 16 of the solder eyelet 10 is flanged outwardly, to crimp the eyelet 10 against the circuit pad 22. The flanging of the base portion 16 may be accomplished by restraining the head portion 14 against motion and forcibly inserting an anvil (not shown) or otherwise expanding the base portion 16 outwardly. The base portion 16 is then flattened against the circuit pad 22 to provide a flange like the flanged head portion 14. The presence of a recess in the base portion 16, as shown in FIG. 3B, is the result of the shape of a particular anvil used for the purpose of upsetting the eyelet. Obviously, any type or shape of anvil may be employed without departing from the spirit and scope of the invention. The use of cross sections of like thickness in the head portion 14 and base portion 16 provides approximate symmetry between these portions. A third step, the insertion of the lead 26 of an electrical component 24 into the central opening of the solder eyelet 10, is then undertaken. The result, an assembly such as shown in FIG. 4 and in FIG. 3B, is therefore ready for a dip soldering process.

In preparation for a dip solder treatment, the electrical component 24 may be held fixed with respect to the circuit board 20, the circuit pad 22, and the eyelet 10, by a sponge rubber sheet (not shown) or other backing material. After a fourth step, consisting of immersion in a solder bath, a completed assembly is provided as shown in FIG. 3C. The solder eyelet and additional solder from the dipping process form a fillet 10' between the lead 26 and the circuit pad 22. The eyelet does not become molten but does flow. After immersion, the eyelet may have the shape shown by the broken lines 11 in the fillet 10'. Solder from the bath forms tangential surfaces with the lead 26 and the circuit pad 22. As shown, the fillet 10' provides extensive areas of contact with both the lead 26 and the circuit pad 22. Thus a good mechanical coupling and a good electrical coupling result from the same structure. It will be understood that the sizes and shapes shown are illustrative only, and not to scale.

As an illustration of a combination which may be employed in following this process, the following values are given. The given composition of solder (22% tin and 78% lead) is completely molten at approximately 525° F. The solder dip is made for only 2½ to 3 seconds at 450° to 460° F. The dimensions of the parts are such that the solder eyelets may have a height and head portion diameter of only 1/10 of an inch each.

The assembly resulting from the process thus undertaken and the structure thus provided is smooth externally, due to melting of the external solder. Internally, however, the solder is fused to the component lead and to the circuit pad. The fusion greatly increases the strength of the assembly. Note also that the use of a solder eyelet decreases the number of joints employed in the assembly. With brass eyelets formerly used, bonding between different types of metals greatly increased the probabilities of faulty construction. Note also that the boards need be dipped for considerably less time than with constructions in prior use, so that much less heat is applied to the circuit board, the wiring structure, and the electrical components.

Thus there has been described a simple, inexpensive method and structure for mounting electrical components in circuit boards. A uniform structure of good mechanical and electrical characteristics is provided although the parts employed may be very small. Because of the strength and reliability of the structure, it may be employed with temperature extremes of wide variation.

What is claimed is:

An eyelet member for printed circuit board assemblies comprising a unitary member consisting of approximately 22% tin and approximately 78% lead whereby to enable low temperature melting thereof, and having a cylindrical central portion with a central aperture therein, a flanged head portion at one end of said central portion and comprising a flange of predetermined thickness extending outwardly from and normal to said central portion, and an inner rim base portion at the other end of said central portion, said base portion having a radial thickness approximately equal to that of the thickness of said flange and an aperture therein coaxial with and of a diameter less than said central aperture.

References Cited in the file of this patent

UNITED STATES PATENTS

| | | |
|---|---|---|
| 364,664 | Norton | June 14, 1887 |
| 1,121,641 | Lounsbury | Dec. 22, 1914 |
| 1,493,076 | Hughes | May 6, 1924 |
| 1,702,234 | Goodridge | Feb. 12, 1929 |
| 1,783,642 | Ferguson et al. | Dec. 2, 1930 |
| 2,244,009 | Hiensch et al. | June 3, 1941 |
| 2,270,166 | Hiensch et al. | Jan. 13, 1942 |
| 2,332,261 | Rohrbach | Oct. 19, 1943 |
| 2,438,075 | Smith | Mar. 16, 1948 |
| 2,474,988 | Sargrove | July 5, 1949 |
| 2,587,568 | Eisler | Feb. 26, 1952 |
| 2,593,479 | Nieter | Apr. 22, 1952 |
| 2,641,748 | Peters | June 9, 1953 |
| 2,671,264 | Pessel | Mar. 9, 1954 |
| 2,680,824 | Beggs | June 8, 1954 |
| 2,756,485 | Abrahamson et al. | July 13, 1956 |
| 2,774,052 | Flour | Dec. 11, 1956 |

OTHER REFERENCES

Photocircuits Electronics, March 1954, page 289.

Welding Handbook, page 516, 3rd ed., copyright 1950, Am. Welding Soc., 33 W. 39th St., New York 18, N.Y.